United States Patent
Arndt et al.

(10) Patent No.: US 6,508,014 B2
(45) Date of Patent: Jan. 21, 2003

(54) METHOD OF DRYING SUBSTRATES

(75) Inventors: Russell H. Arndt, Wappingers Falls, NY (US); Glenn Walton Gale, Austin, TX (US); James Willard Hannah, Ossining, NY (US); Kenneth T. Settlemyer, Jr., Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/784,876

(22) Filed: Feb. 16, 2001

(65) Prior Publication Data

US 2002/0112369 A1 Aug. 22, 2002

(51) Int. Cl.$^7$ .................................................. F26B 5/00
(52) U.S. Cl. .............................. 34/467; 34/402; 34/409; 34/474
(58) Field of Search .......................... 34/343, 348, 351, 34/359, 402, 409, 412, 443, 467, 470, 474, 476, 312, 315, 320, 321, 324

(56) References Cited

U.S. PATENT DOCUMENTS

| 3,943,002 | A | * | 3/1976 | Scheurle et al. ............... 136/33 |
| 4,777,734 | A | * | 10/1988 | Elferink ........................ 34/34 |
| 4,984,597 | A | | 1/1991 | McConnell et al. |
| 5,243,769 | A | * | 9/1993 | Wang et al. .................... 34/27 |
| 5,571,337 | A | | 11/1996 | Mohindra et al. |
| 5,715,612 | A | * | 2/1998 | Schwenkler .................. 34/470 |
| 6,067,727 | A | * | 5/2000 | Muraoka ........................ 5/200 |
| 6,095,167 | A | * | 8/2000 | Florez ........................ 134/183 |
| 6,139,645 | A | * | 10/2000 | Leenars et al. ............... 134/30 |
| 6,192,600 | B1 | * | 2/2001 | Bergman ...................... 34/267 |
| 6,286,230 | B1 | * | 9/2001 | White et al. .................. 34/403 |
| 6,286,231 | B1 | * | 9/2001 | Bergman et al. .............. 34/410 |
| 6,286,524 | B1 | * | 9/2001 | Okuchi et al. ............. 134/95.2 |
| 6,289,605 | B1 | * | 9/2001 | Chang ........................ 34/471 |

FOREIGN PATENT DOCUMENTS

EP  0 385 536  9/1990

* cited by examiner

Primary Examiner—Ira S. Lazarus
Assistant Examiner—K. B. Rinehart
(74) Attorney, Agent, or Firm—Steven Capella

(57) ABSTRACT

A method of removing water from the surface of a silicon wafer or other substrate subjected to wet processing which includes a step of water rinsing. In this method a silicon wafer whose surface includes liquid water is disposed in an atmosphere saturated with water vapor. The water vapor is removed from the surface of the silicon wafer by a stream of water-saturated gas. Upon removal of liquid water from the surface of the silicon wafer the water vapor in the water vapor saturated atmosphere is removed by evaporation.

10 Claims, No Drawings

METHOD OF DRYING SUBSTRATES

BACKGROUND OF THE DISCLOSURE

1. Field of the Invention

The present invention is directed to a method of removing water from a silicon wafer or other substrate surface without the attendent formation of watermarks. More specifically, the present invention is directed to a method of removing water from the surface of a silicon wafer or other substrate by means of an inert gas stream in an atmosphere saturated with water vapor to suppress evaporative drying so that the liquid water is physically removed from the surface of the wafer without the attendant formation of watermarks.

2. Background of the Invention

The production of semiconductor devices include the processing of silicon or other semiconductor material wafers which serve as the semiconductor chip. Amongst the processing steps to which silicon wafers are subjected is at least one wet processing step which is terminated with a rinsing step with deionized water or other aqueous fluid. The rinsed water must be removed from the surface of the wafer in order to insure that the surface is free of moisture and chemical/particulate impurities or contaminants to provide optimal performance of the semiconductor device formed upon the silicon wafer.

The seemingly simple step of removing the liquid rinse water is anything but simple. This processing step has been a persistent and continuing problem in the processing of semiconductor chips. Specifically, the rinse water removal step has been plagued by the formation of "watermarks" on the wafer surface. Suffice it to say, the retention of watermarks on the surface of silicon wafers adversely affects semiconductor device performance.

The "watermarks" on the surface of silicon wafers are primarily the result of evaporative concentration of silica that has been etched from hydrophobic silicon areas of the wafer surface during water rinsing.

Etching occurs in pure, neutral (pH 7) water due to the natural ionization of water, yet becomes highly suppressed by adding enough acid to bring the pH down as little as two units (pH 5).

Acidification is one strategy to suppress unintended etching of Si in water with at best mixed results. Silicon etching is suppressed upon introduction of the acid; however, the acid also causes any previously formed soluble silicates (e.g., $H_2SiO_3$) to become less soluble colloidal silica, thus causing watermark formation. One attempt to use acid as a watermark prevention agent involved the introduction of carbon dioxide gas into a centrifugal drying process. The control of resulting carbonic acid on the wafer surface is problematic. Thus, the process requires very careful control and/or leads to very mixed results.

Other methods of addressing the aforementioned problem have been proposed. For example, U.S. Pat. No. 4,984,597 teaches the use of a drying vapor, preferably isopropanol, in conjunction with an inert carrier gas, to effectuate water removal from the surface of the silicon wafer. As those skilled in the art are aware, isopropanol is acidic. Thus, the above remarks regarding the detrimental effects of acidic conditions suggests the adverse consequences of employing isopropanol or other like alcohols in this application. It is moreover emphasized that isopropanol employed in the '597 patent is present as a vapor. Isopropanol, however, is a liquid at ambient temperature and pressure. As such, isopropanol must also be subsequently removed from the wafer surface, entailing a further processing step. Yet another disadvantage of employing isopropanol is that isopropanol and other like alcohols are flammable and thus present environmental and safety problems.

U.S. Pat. No. 5,571,337 describes a process in which selected portions of a wafer surface is treated with an inert carrier gas or a mixture of a gaseous solvent and an inert carrier gas to remove liquid accumulated thereon. The process of the '337 patent requires careful control of the water removal process which is generally impractical.

European Patent Application 0 385 536 describes the utilization of an organic solvent vapor miscible with liquid accumulated on the surface of the silicon wafer. This organic vapor is again preferably isopropanol. The theory driving the process of the '536 application is that isopropanol vapor, when mixed with the liquid on the surface of the wafer, yields a product whose surface tension is lower than the surface tension of the liquid on the wafer surface. This difference in surface tension results in a gradient in the film of the liquid which causes a force to be exerted on the liquid film in the direction of a liquid bath. This phenomena is well known in that art as the Marangoni effect. The aforementioned discussion of the disadvantages of using isopropanol explains the disadvantages of this approach.

The above discussion explains that current silicon wafer drying techniques suffer from significant failings. Thus, the art is in need of a new process for removal of water from the surface of a silicon wafer or other substrate that is safe, does not require further processing steps and, most importantly, results in the production of silicon wafers or other substrates free of watermarks.

SUMMARY OF THE INVENTION

A new method has now been developed for the removal of surface water from the surface of a silicon wafer or other substrate. This method overcomes problems of incomplete removal of surface water, detrimental effects of fluids employed in removing water and introduction of acidic or hydroxyl-containing species enhancing chemical reactions resulting in the formation of watermarks.

In accordance with the present invention a method is provided wherein water present on a surface of a silicon wafer or other substrate is removed by disposing the wafer in an atmosphere saturated with water vapor whereupon liquid water and/or any aqueous solutions is physically removed from the surface of the wafer by a water saturated gas stream, more preferably, a water saturated inert gas stream. Thereupon, the last monolayer of water is removed by evaporation.

DETAILED DESCRIPTION

The method of the present invention is directed to the removal of liquid water and/or aqueous solution from the surface of a silicon wafer employed in the manufacture of semiconductor chips. In this method a silicon wafer, which has been subjected to wet processing, including the step of rinsing with water, is subjected to processing to remove the water without the attendant formation of watermarks.

While the invention is described below in connection with silicon wafers, it should be appreciated that the present invention also encompasses the use of the water removal method for other semiconductor material wafers and other substrates.

The first step in the method of the present invention involves disposing of the silicon wafer in a water vapor saturated atmosphere environment. This step of placing a silicon wafer, whose surface is coated with water and/or aqueous solution or dispersion, in a water vapor saturated environment prevents the liquid water on the surface of the silicon wafer from evaporating and precipitating colloidal silica thereon.

The next step in the method of the present invention is the physical removal of surface water from a water saturated wafer. This step is accomplished by aiming a stream of gas, preferably an inert gas, at elevated pressure relative to the water-saturated pressure of the water vapor saturated atmosphere, at the water-covered surface of silicon wafer surface. This stream of water-saturated gas physically forces the aqueous liquid from the surface of the wafer.

To accomplish this task one or more nozzles, in communication with a source of pressurized water-saturated gas, is aimed at the silicon wafer surface laden with water. As long as the nozzle or nozzles are appropriately positioned it is inconsequential how the wafer is disposed in the water vapor saturated atmospheric chamber. Thus, the wafer position may be vertical, horizontal, angled or upside down. The wafer may be in any position as long as the nozzles are appropriately positioned relative to the position of the wafer. Indeed, the wafer may be stationary or moving. Of course, if the wafer is allowed to move so too must the nozzles dispensing the water-saturated gas at the wafer surface. During this water removal step process parameters, such as wafer angle/position, gas dispensing pressure, gas flow rate, temperature and speed of wafer movement, are maintained at optimized water removal efficiency.

It is furthermore emphasized that although the above description suggests a single exposure of the silicon wafer to the stream of inert gas, two or more such passes through the inert gas stream may occur to insure that physical removal of water from the surface of the silicon wafer is complete.

In a second preferred embodiment of the step of physically removing water from the surface of the silicon wafer, one or more silicon wafers whose surface is laden with water is disposed in fixed position in an atmospheric chamber of the type discussed in the first embodiment. A manifold, in communication with a source of a water-saturated gas, is also located in fixed position such that its multiplicity of openings is aimed at the water coated surface of the silicon wafer. The means holding the silicon wafer and the manifold, although fixed in relationship to each other, is rotatable in the atmospheric chamber. As such, the wafer is rotated while being subjected to a water-saturated gas stream. This method provides efficient physical removal of liquid water on the surface of the silicon wafer.

The water-saturated gas which is utilized to physically remove the water from the surface of the wafer is preferably gas which does not react with the silicon surface, the water and any component in aqueous solution or dispersion. Preferred gases are substantially inert gases such as nitrogen, argon, neon and the like. Of these, nitrogen and argon are particularly preferred. Nitrogen, because of its availability and cost, is most preferred in this application.

In an alternate embodiment, the water-saturated gas may contain a second, non-inert gas added to the inert gas to form a modified gaseous mixture stream. The second non-inert gas is characterized by its ability to acidify water on the surface of the silicon wafer. This second gas thus serves to suppress silicate formation. As indicated earlier, the formation of silicates, an essential prerequisite to the ultimate formation of watermarks, is catalyzed by hydroxyl groups. The presence of acid may reduce or completely remove hydroxyl group presence thus inhibiting the catalyzation of the formation of soluble silicates. The use of an acidifying gas component may require more elaborate process control and may be undesirable when the liquid at the wafer surface has a significant soluble silicate content.

Although any gas which acidifies water may be utilized as the second non-inert gas in the present invention, it is particularly preferred that the acidifying gas be carbon dioxide given its easy availability and low cost. Therefore, in the preferred embodiment, wherein a second non-inert gas is employed in water removal gas stream, a particularly preferred gas stream aimed at the surface of the water laden silicon wafer is a gaseous mixture of nitrogen and carbon dioxide.

The last step in the method of the present invention is the removal of the saturated water vapor atmosphere. This final step is effectuated by evaporation. The physical removal of liquid water from the surface of the silicon wafer prior to evaporation of the water vapor in the water vapor saturated atmosphere leaves a thin layer of liquid water in equilibrium with its water vapor environment. The final step of evaporation removes this layer concurrently with the water vapor in the atmosphere thus avoiding the formation of a watermark. The final step of evaporation may be conducted under various thermodynamic conditions such as elevated temperature and ambient pressure or ambient temperature and reduced pressure.

The above embodiments are provided to illustrate the scope and spirit of the invention. These embodiments will may apparent, to those skilled in the art, other embodiments and examples. These other embodiments and examples are within the contemplation of the present invention. Therefore, the present invention should be limited only by the appended claims.

What is claimed is:

1. A method of removing liquid water from a surface of a substrate comprising:

disposing a substrate whose surface includes water in the liquid state in an atmosphere saturated with water vapor;

removing said liquid water from said surface of said substrate by applying a water-saturated gas stream which forces said liquid water from said surface of said substrate; and evaporating said water vapor from said saturated water vapor atmosphere.

2. A method in accordance with claim 1 wherein water-saturated gas comprises a gas selected from the group consisting of nitrogen, argon and neon.

3. A method in accordance with claim 2 wherein said gas is nitrogen or argon.

4. A method in accordance with claim 3 wherein said gas is nitrogen.

5. A method in accordance with claim 1 wherein said gas stream includes a second gas which acidifies water.

6. A method in accordance with claim 5 wherein said second gas is carbon dioxide.

7. A method in accordance with claim 1 wherein said gas stream is provided at elevated pressure relative to the pressure of said water vapor saturated atmosphere, said gas stream directed to said liquid water laden surface of said substrate by at least one high pressure nozzle.

8. A method in accordance with claim 1 wherein said saturated water vapor atmosphere is provided in an atmospheric chamber in which said substrate is disposed.

9. A method in accordance with claim 8 wherein said atmospheric chamber includes high pressure nozzles aimed at the surface of said water laden surface of said substrate whereby said gas stream is directed to remove said water from said surface of said substrate.

10. A method in accordance with claim 8 wherein said atmospheric chamber is provided with holding means for maintaining at least one substrate and a manifold, in communication with a source of high pressure gas stream, aimed at the surface of said water laden substrate, said holding means and said manifold rotating but remaining in fixed relationship to each other.

* * * * *